US008525298B2

(12) United States Patent
Yang

(10) Patent No.: US 8,525,298 B2
(45) Date of Patent: Sep. 3, 2013

(54) PHASE CHANGE MEMORY DEVICE HAVING 3 DIMENSIONAL STACK STRUCTURE AND FABRICATION METHOD THEREOF

(75) Inventor: Ki Ho Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 348 days.

(21) Appl. No.: 12/782,853

(22) Filed: May 19, 2010

(65) Prior Publication Data
US 2011/0147690 A1  Jun. 23, 2011

(30) Foreign Application Priority Data
Dec. 22, 2009 (KR) .......................... 10-2009-0128785

(51) Int. Cl.
*H01L 29/00* (2006.01)
(52) U.S. Cl.
USPC ................... 257/537; 257/536; 257/2; 257/5; 257/E31.002
(58) Field of Classification Search
USPC ............................ 257/536, 537, 2, 5, E31.002
See application file for complete search history.

(56) References Cited

U.S. PATENT DOCUMENTS

| 6,764,894 | B2 * | 7/2004 | Lowrey .......................... 438/238 |
| 2008/0112211 | A1 * | 5/2008 | Toda .............................. 365/148 |
| 2009/0137112 | A1 * | 5/2009 | Tabata et al. ................... 438/631 |
| 2009/0141532 | A1 * | 6/2009 | Nagashima et al. ............ 365/51 |
| 2010/0034016 | A1 * | 2/2010 | Liu ................................ 365/163 |
| 2011/0140070 | A1 * | 6/2011 | Kim .................................. 257/5 |

FOREIGN PATENT DOCUMENTS

| JP | 2009-016400 A | 1/2009 |
| KR | 1020080048314 A | 6/2008 |
| KR | 1020080096432 A | 10/2008 |

* cited by examiner

*Primary Examiner* — Julia Slutsker
(74) *Attorney, Agent, or Firm* — Ladas & Parry LLP

(57) ABSTRACT

A phase change memory device having a 3-D stack structure and a fabrication method for making the same are presented. The phase change memory device includes a semiconductor substrate, a word line structure and one or more phase change structures. The word line structure extends in one first direction on the semiconductor substrate. The one or more phase change structures extend mutually in parallel from one sidewall of the word line structure. The, the memory cell including a switching device, one side of the switching device contacted with the one sidewall of the word line structure, a heating electrode formed on the other side portion of the switching device, and a phase change pattern, one sidewall of the phase change pattern contacted with the heating electrode.

26 Claims, 7 Drawing Sheets

PHASE CHANGE MEMORY DEVICE HAVING 3 DIMENSIONAL STACK STRUCTURE AND FABRICATION METHOD THEREOF

CROSS-REFERENCES TO RELATED APPLICATION

The present application claims priority under 35 U.S.C. 119(a) to Korean application number 10-2009-0128785, filed on Dec. 22, 2009, in the Korean Patent Office, which is incorporated by reference in its entirety as if set forth in full.

BACKGROUND OF THE INVENTION

1. Technical Field

The inventive concept relates to a non-volatile semiconductor memory device and a fabrication method thereof and, more particularly, to a phase change memory device having a 3 dimensional stack structure and a method of fabricating the same.

2. Related Art

Semiconductor memory devices are classified into volatile memory devices and nonvolatile memory devices depending on retention of stored data after power is turned off. DRAM (Dynamic Random Access Memory) and SRAM (Static Random Access Memory) are regarded as the volatile memory devices and the flash memory devices, i.e., the EEPROM (Electrically Erasable Programmable Read Only Memory) devices are regarded as the nonvolatile memory devices.

Currently, flash memory devices which are nonvolatile memory devices are frequently used in a variety of electronic appliances such as digital cameras, cellular phones, or MP3 players. However, it takes a relatively long time to program data into the flash memory devices or to read from the flash memory devices. New semiconductor devices have been developed as substitutes of flash memory devices, such as, MRAM (Magnetic Random Access Memory), FRAM (Ferroelectric Random Access Memory) or Phase-change Random Access Memory (PRAM).

A phase change memory device as a substitute memory device uses phase change material which reversibly phase-changes between a crystalline state and an amorphous state by exposure to heat in the storage medium. Typically, a chalcogenide (GST)-based material which is comprised of germanium (Ge), antimony (Sb) and tellurium (Te) is used as the phase change material. The heat supply source for the phase change material is electric current through a conductor that releases an amount of heat (i.e., Joule heating) which depends on the intensity of the supplied current and the current supply time. Phase change materials also exhibit different electrical resistivities according to the crystalline state and the amorphous state so that a logic information scheme can be designed which depends on the resistance differences exhibited between the phases.

However, a problem in the phase change memory device is a need to improve of their integrity, i.e., compactness. Accordingly, a study for reduction in chip dimensions has been developed. However, due to limit of exposure light source, it faces to limit to reduce a minimum feature size.

SUMMARY

The phase change memory device may include a semiconductor substrate, a word line structure extended in one first direction on the semiconductor substrate, and one or more phase change structures extended mutually in parallel from one sidewall of the word line structure. The phase change structure includes a phase memory cell, the memory cell including a switching device, one side of the switching device contacted with the one sidewall of the word line structure, a heating electrode formed on the other side portion of the switching device, and a phase change pattern, one sidewall of the phase change pattern contacted with the heating electrode.

The phase change memory device may also include a semiconductor substrate where a cell region and a device isolation region are provided, a word line structure disposed on one edge portion of the cell region and being comprised of a plurality of word lines are stacked, each of the word line interposed between interlayer insulating layers, and a plurality of phase change structures extended in parallel to each other in an orthogonal direction with respect to extending direction of the word line structure and formed at the one sidewall of the word lines, wherein each of the phase change structures is comprised of stacked phase change memory cells, the stacked phase change memory cells are insulated by the interlayer insulating layers, and each of phase change memory cells includes a switching device, a heating electrode and a phase change pattern disposed in the orthogonal direction with respect to extending direction of the word line structure.

Also provided is a method of manufacturing a phase change memory device. First, a semiconductor substrate where a cell region and a device isolation region are defined is provided. A word line structure including a plurality of word lines stacked is formed on one side of the cell region of the semiconductor substrate. A plurality of phase change structures is formed. Each of the phase change structures includes a plurality of phase change memory cells which are extended mutually in parallel from one sidewall of the word line structure. Each of phase change memory cells includes a switching device, a heating electrode and a phase change pattern sequentially formed along an extension direction. Upper electrodes are formed on sidewalls of the plurality of phase change structures respectively. Bit lines are formed on the phase change structures and extended to be contacted with the upper electrodes. The phase memory cells in the phase change structures are stacked corresponding to a number of the word lines.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
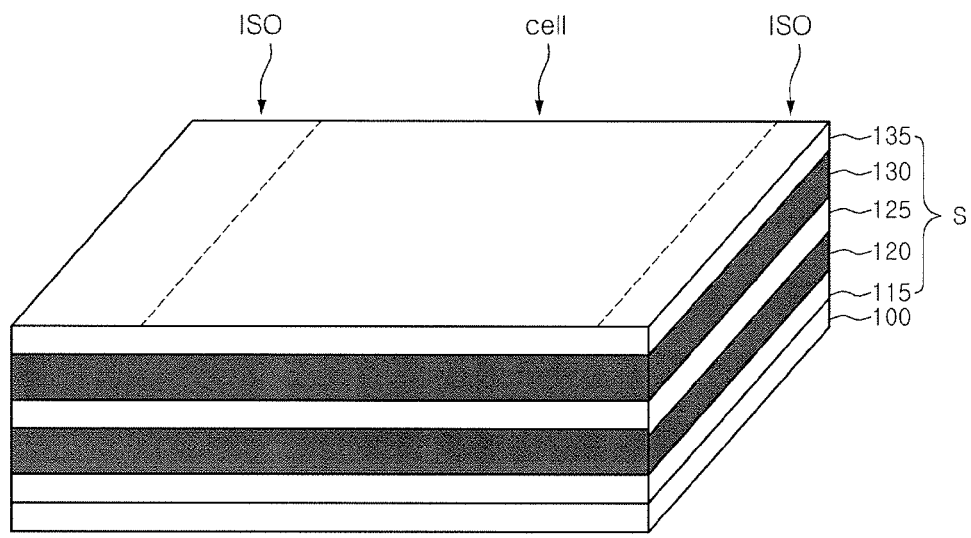
FIGS. 1 through 13 are perspective views illustrating a method of manufacturing a phase change memory device according to an exemplary embodiment.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 1 to 13 are perspective views illustrating a method of manufacturing a phase change memory device according to an exemplary embodiment.

Referring to FIG. 1, a first interlayer insulating layer 115, a first conduction layer 120, a second interlayer insulating layer 125, a second conduction layer 130 and a third interlayer insulating layer 130 are sequentially deposited on a semiconductor substrate 100 which is divided into a cell region cell and an isolation region ISO to form a stack structure S. The first and second conduction layers 120 and 130 may be comprised of a material serving as a word line, for example a metal layer such as tungsten and formed at the same thickness.

Figure 2:
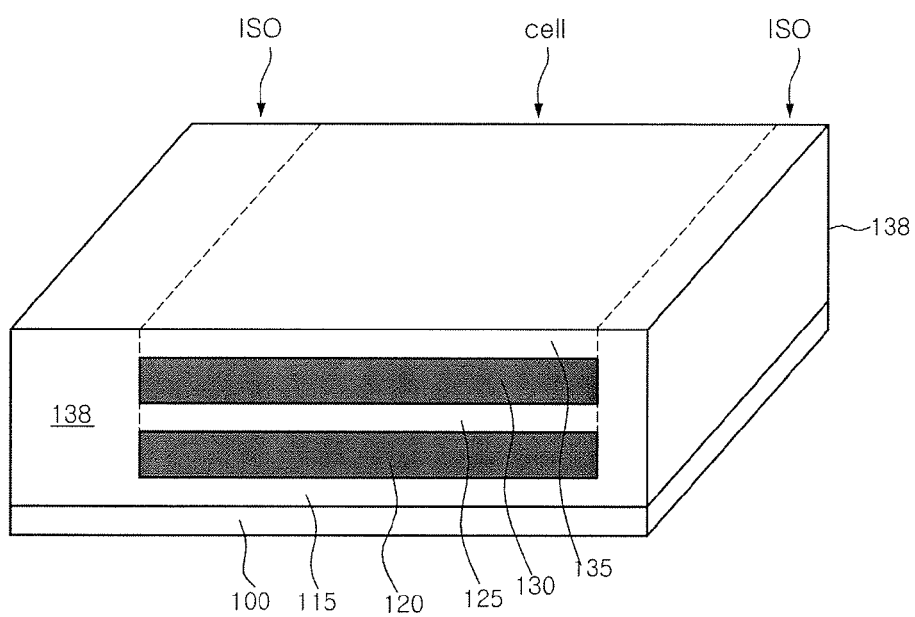

Referring to FIG. 2, a mask pattern (not shown) is formed on a resultant of the semiconductor substrate 100 corresponding to the cell region cell and an exposed portion of the stack structure S is etched such that the stack structure S remains at the cell region cell. Subsequently, the mask pattern may be removed through a conventional method. Next, a first planarizing layer 138 is deposited to be sufficiently buried within the isolation region ISO and then chemical mechanical polished such that the first planarizing layer 138 remains substantially peripheral of the stack structure S on the cell region cell. The chemical mechanical polishing process may be performed to expose the third interlayer insulating layer 135. The first planarizing layer 138 may serve as for example, a device isolation layer and may be formed of an insulating material such as a silicon insulating layer.

Figure 3:
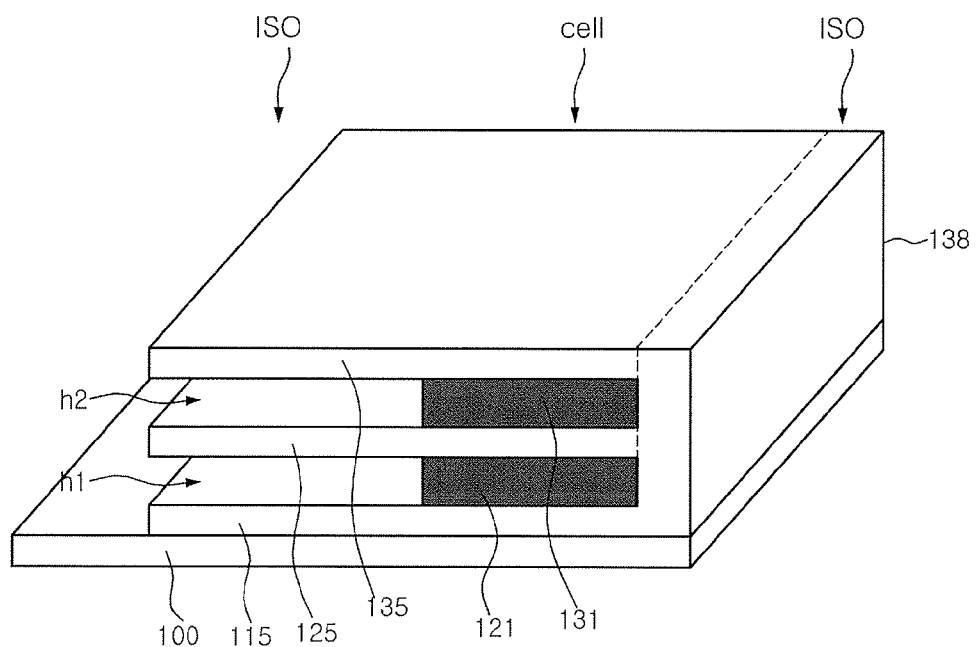

Referring to FIG. 3, a portion of the first planarizing layer 138 which is arranged on one side of the stack structure S of the cell region cell is selectively removed. The selective removal of the first planarizing layer 138 is performed through a conventional photolithographic process. By the selective removal of the first planarizing layer 138, sidewalls of the first and second conduction layers 120 and 130 are exposed. Subsequently, the exposed sidewalls of the first and second conduction layers 120 and 130 are etched by a constant length (width) so that the first and second conduction layers 120 and 130 remain at one side edge of the cell region cell. The remaining first and second conduction layers 120 and 130 serve a first and a second word lines. At this times, by removal of the first and second conduction layers 120 and 130, horizontal holes h1 and h2 are formed between the first and second interlayer insulating layers 115 and 125 and between the second and third interlayer insulating layers 125 and 135 and The horizontal holes h1 and h2 have openings disposed at the sidewalls. The first and second conduction layers 120 and 130 may be removed by a wet etching process.

Figure 4:
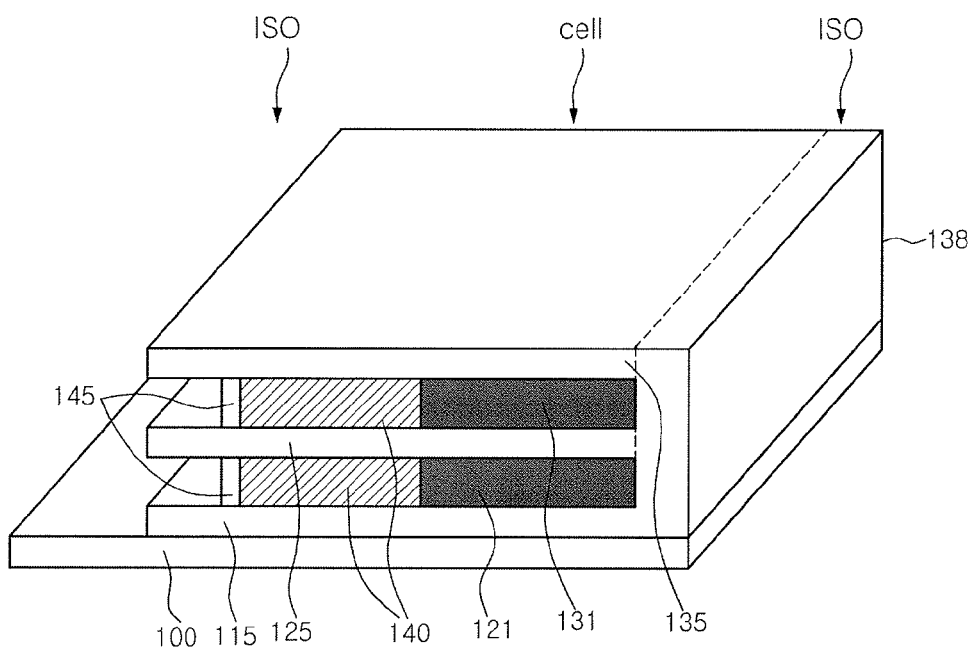

Referring to FIG. 4, Schottky diode layers 140 are formed in the horizontal holes h1 and h2, respectively. The Schottky diode layers 140 are formed by depositing a polysilicon layer doped with n type or p type impurities on the sidewalls of the first and second word lines within the horizontal holes h1 and h2 and etched back, for example isotropically etched back. At this time, total horizontal lengths of the Schottky diode layers 140 and the word line 121 or 131 are shorter than the horizontal lengths of the horizontal holes h1 and h2.

Next, ohmic contact layers 145 are formed on side surfaces of the Schottky diode layers 140. At this time, the ohmic contact layers 145 are formed by forming a transition metal layer (not shown) and performing a selective heat treatment. The ohmic contact layers 140 may be formed by depositing an ohmic contact material itself.

Figure 5:
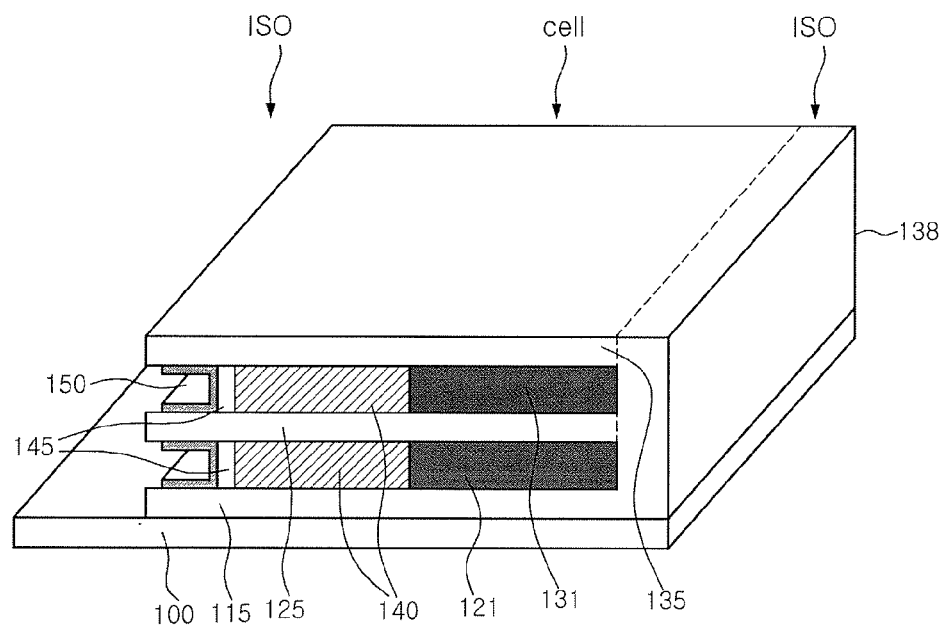

Referring to FIG. 5, a conduction layer for a heating electrode is deposited along the inner surface of the horizontal holes h1 and h2 and etched back remain within the horizontal holes h1 and h2, thereby forming heating electrodes 150 on surfaces of the ohmic contact layers 145 and on inner surfaces of the horizontal holes h1 and h2.

Figure 6:
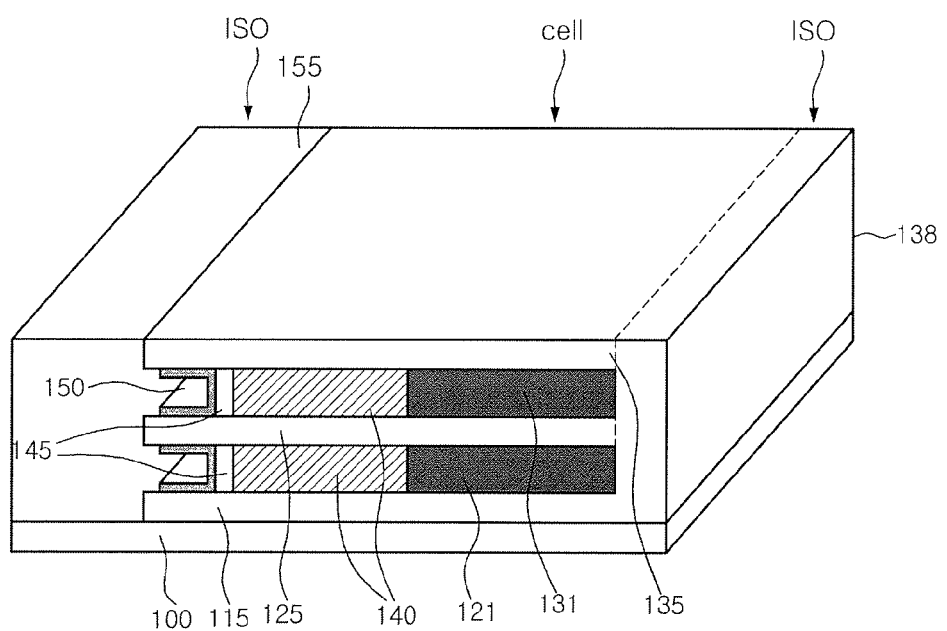

Referring to FIG. 6, a second planarizing layer 155 is formed to make a resultant of the semiconductor substrate 100 to have a substantial uniform height so as to perform the following node separation process.

Figure 7:
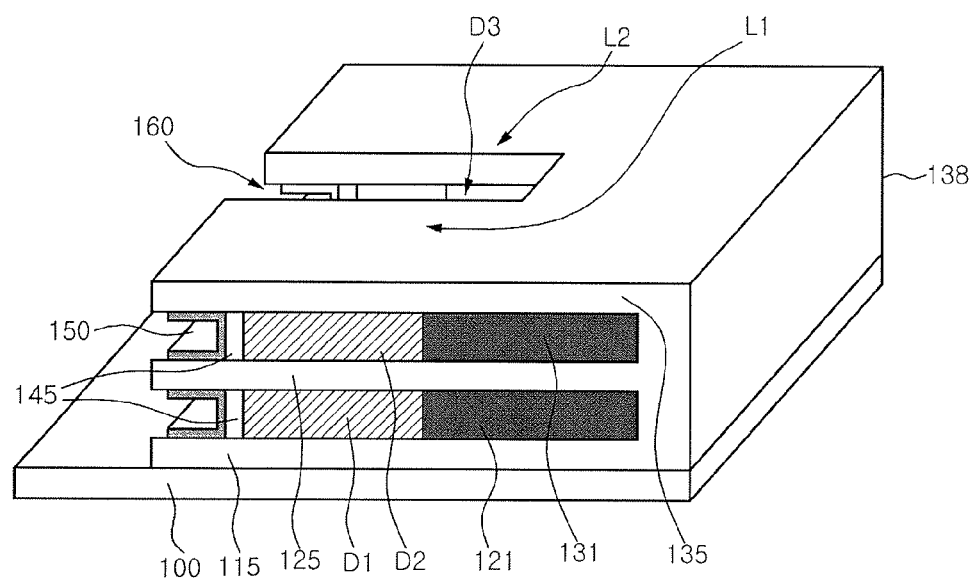

Referring to FIG. 7, so as to individually node separate the extended stack Schottky diode layers 140, at least one line type groove 160 is formed in the extended stack Schottky diode layers 140. According to this, the extended stack Schottky diode layers 140 are divided into a plurality of line structures L1 and L2 and a plurality of Schottky diodes D1 and D2 which are stacked above and below within the plurality of line structures L1 and L2 respectively are defined. At this time, one side edge of the line type groove 160 may be contacted with the second planarizing layer 155 and the other edge of the line groove 160 may be contacted with the word lines 121 and 131. Next, the second planarizing layer 155 is removed. The second planarizing layer 155 may be removed by a dipping method using a wet echant.

Figure 8:
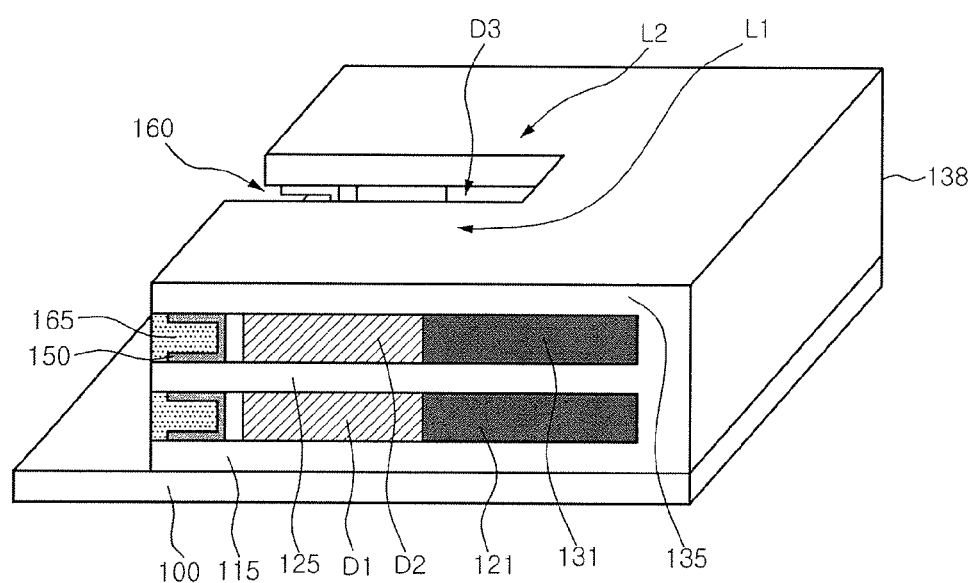

Referring to FIG. 8, a phase change material is deposited on a resultant of the semiconductor substrate 100 to be buried within the horizontal holes h1 and h2 and etched back, thereby forming phase change patterns 165 buried within the horizontal holes h1 and h2. One side surface of each of the phase change pattern 165 is exposed to the outside and a remaining surface that is, top surface, bottom surface and the other side surface of the phase change material pattern 165 are surrounded by the heating electrode 150. According to this, phase change structures of the line structure type L1 and L2 are obtained. Hereinafter, the switching device D1 or D2, the heating electrode 150 and the phase change pattern 165 formed in one of the horizontal holes h1 or h2 may be commonly called a phase change memory cell. The line structures L1 and L2 being composed of stacked phase change memory cells may be called the phase change structures. The phase change structures L1 and L2 and the Phase change memory cells preferably extend in an orthogonal direction with respect to the extending direction of the word lines 121 and 131.

Figure 9:
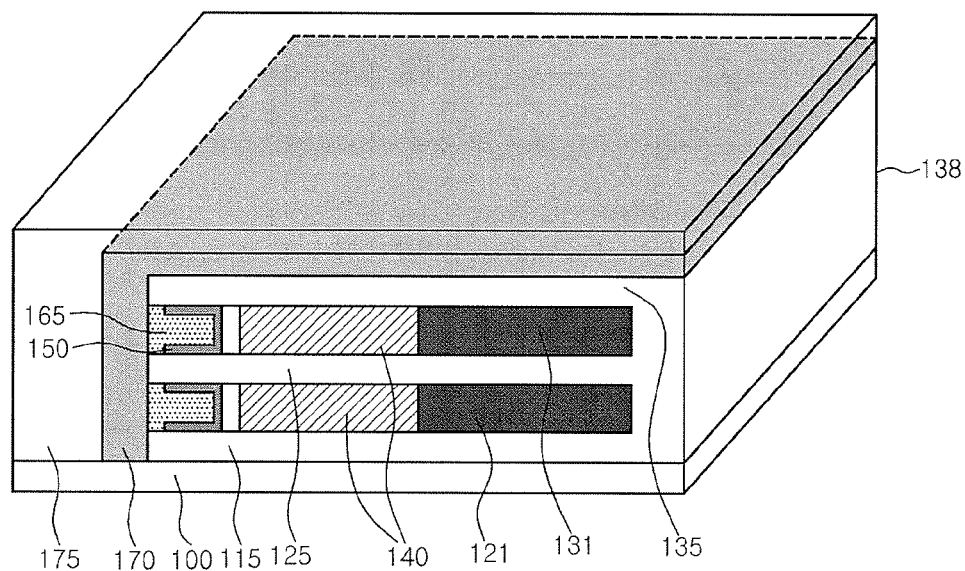

Referring to FIG. 9, a conduction layer 170 for a top electrode is deposited along a resultant surface of the semiconductor substrate 100 at a desired thickness and etched back and to be formed on the upper and side portions of the line structures L1 and L2 and within the line type groove 160. Next, an insulating layer 175 for device isolation is deposited on a resultant of the semiconductor substrate 100 where the conduction layer 170 for a top electrode is formed and planarized to remain on the conduction layer 170 for a top electrode at a desired thickness. According to this, the resultant structure of the semiconductor substrate 100 has a planarized surface.

Figure 10:
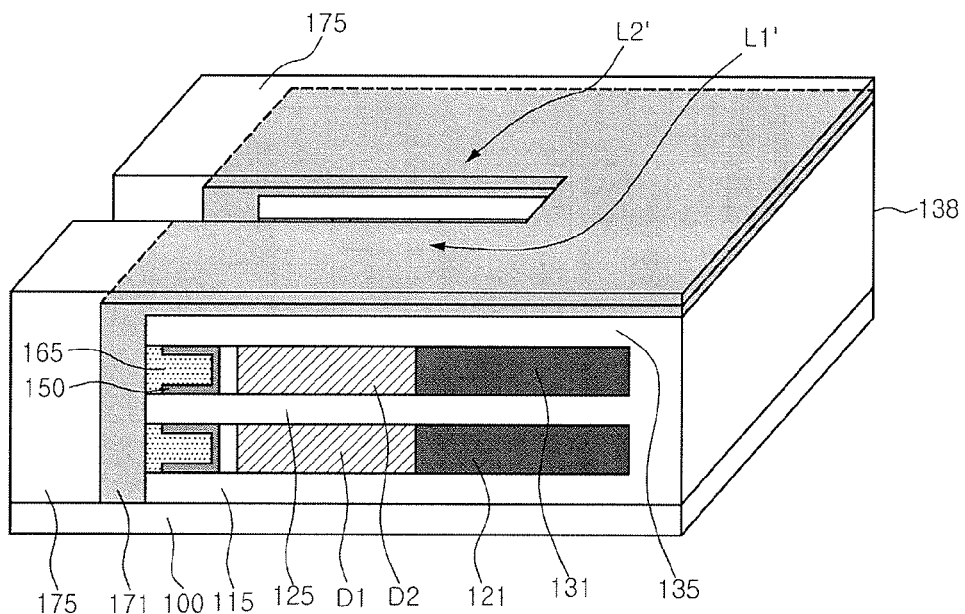

Referring to FIG. 10, the conduction layer 170 for a top electrode 170 and the insulating layer 175 for device isolation are patterned in the shape of the phase change structures L1 and L2 so as to node separate the conduction layer 170 for an upper electrode. According to this, the upper electrodes 171 are formed in unit of the phase change structures L1 and L2. That is, the plurality of phase change memory cells constituting one phase change structure L1 or L2 may be electrically connected to one top electrode 171. Herein, L1' and L2 designate phase change structures where the upper electrodes 171 are formed in the side portion.

Figure 11:
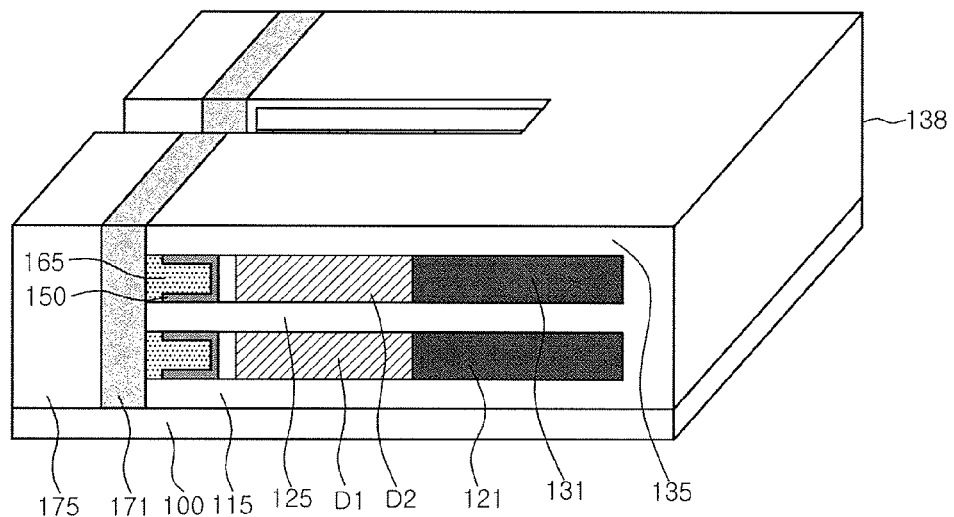

Referring to FIG. 11, a third planarizing layer (not shown) is deposited on a resultant of the semiconductor substrate 100 and then the third planarizing layer, the insulating layer 175 for device isolation and the conduction layer 170 for a top electrode are chemical mechanical polished to expose the third interlayer insulating layer 135 which is the uppermost interlayer insulating layer. The third planarizing layer is provided to perform the chemical mechanical polishing process and may remain between the phase change structures L1' and L2'. By the chemical mechanical polishing process, an upper surface of the top electrode 171 is exposed to the outside.

Figure 12:
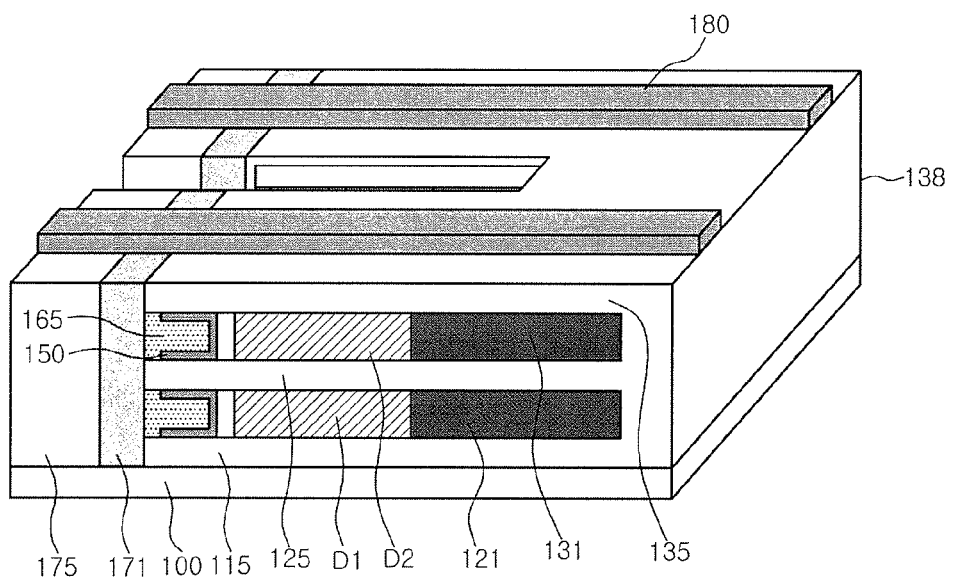

Referring to FIG. 12, a metal layer is deposited on a resultant of the semiconductor substrate 100 and patterned to form a bit line 180 in parallel to the phase change structures L1' and L2' on the phase change structures L1' and L2'. At this time, the bit line 180 may have a narrower width than the phase change structures L1' and L2'.

Figure 13:
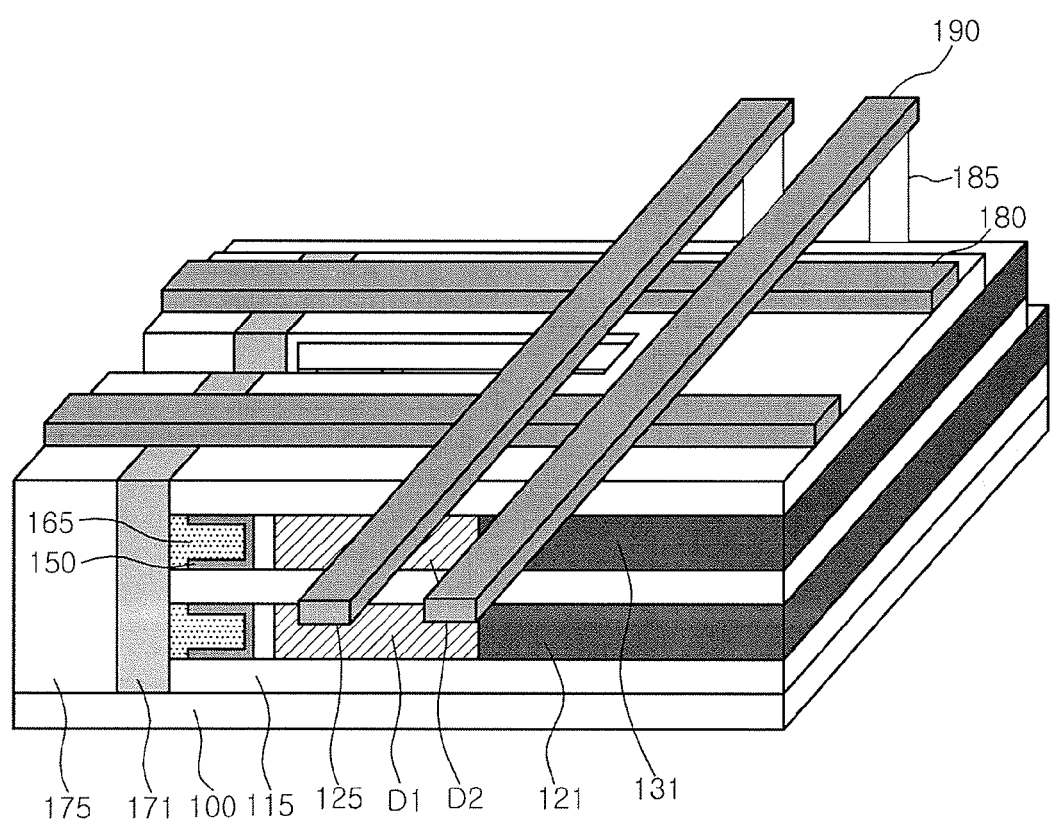

Referring to FIG. 13, one side edge portions of the third interlayer insulating layer 135, the second word line 131 and the second interlayer insulating layer 125 are etched to expose a portion of the first word line 121 which is the lowest word line. Subsequently, the one side portion of the third interlayer insulating layer 135 is further etched to expose a portion of the second word line 131. One side edge portions of the first and second word lines 121 and 131 have a step structure through the above etching process. Next, an inter-metal layer insulating layer (not shown) is formed on a resultant of the semiconductor substrate 100 and then etched to form contact hoes (not shown) exposing the first and second word lines 121 and 131 having the step structure. A conduction layer is buried within the contact holes to form contact plugs 185 and word line wirings 190 are formed to be contacted with the contact plugs 185 and to be substantially orthogonal to the bit line 180. In the FIG. 13, the first planarizing layer 138 is omitted to show a connecting relation among the first and second word lines 121 and 131, the contact plugs 185 and the word line wirings 190.

In the phase change memory device of the exemplary embodiment, the switching diode D1 and D2 and the phase change pattern 165 which constitute the phase memory cell are extended in a line shape in the horizontal direction and the plurality phase memory cells of line shapes are stacked so that the plurality of phase change memory cells may be integrated within the limited area.

This inventive concept is not limited to the above embodiment. For example, the exemplary embodiment illustrates two layered word line for convenience, but it is not limited thereto. As many word lines as possible may be stacked within the scope of available process conditions. Furthermore, the exemplary embodiment illustrates two line structures, but it is not limited thereto. A plurality of line structures are extended to the word lines 121 and 131 extended to the constant direction.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A phase change memory device, comprising:
    a substantially planar semiconductor substrate;
    a word line extending along a first direction substantially in parallel to the planar semiconductor substrate, wherein the word line includes a first sidewall and a second sidewall; and
    a phase change structure extending in parallel with the planar semiconductor substrate and formed on the first sidewall of the word line,
    wherein the phase change structure comprises a switching device formed on the first sidewall of the word line, a heating electrode formed on one sidewall of the switching device, and a phase change pattern formed on one sidewall of the heating electrode,
    and the first and second sidewalls are formed in a second direction perpendicular to the first direction, and the second direction is substantially parallel to the planar semiconductor substrate.

2. The phase change memory device of claim 1, further comprising a plurality of word lines which are stacked and interposed between interlayer insulating layers and that each word line extends along the first direction substantially in parallel to the planar semiconductor substrate.

3. The phase change memory device of claim 2, wherein the phase change structure is also stacked and interposed between interlayer insulating layers so that the stacked phase change structure is aligned to corresponds to the stacked word lines.

4. The phase change memory device of claim 1, further comprising an upper electrode contacting the phase change pattern of the phase change structure,
    wherein the upper electrode is formed on one sidewall of the phase change pattern.

5. The phase change memory device of claim 4, further comprising a first device isolation layer disposed at one sidewall of the upper electrode and a second device isolation layer disposed at the other sidewall of the word line.

6. The phase change memory device of claim 4, further comprising a bit line formed over the phase change structure such that the bit line contacts to the upper electrode.

7. The phase change memory device of claim 6, further comprising a word line wiring formed over the bit line and insulated away from the bit line such that the word line wiring is electrically connected to the word line via a contact plug.

8. The phase change memory device of claim 7, wherein the word line wiring extends substantially in parallel to the word line and extend substantially perpendicular or orthogonal to the bit line.

9. The phase change memory device of claim 1, wherein the switching device comprises a conductive polysilicon Schottky diode.

10. The phase change memory device of claim 1, wherein the phase change structure further includes an ohmic contact layer formed between the switching device and the heating electrode.

11. The phase change memory device of claim 10, wherein the heating electrode is formed to surround a surface of the phase change pattern except the one sidewall of the phase change pattern which is contacted to an upper electrode.

12. A phase change memory device, comprising:
    a substantially planar semiconductor substrate having a cell region and a device isolation region;
    a plurality of word lines disposed on the cell region, such that each word line extends along a first direction and each word line is substantially in parallel to each other word line, each word line is also substantially in parallel to the planar semiconductor substrate and that the word lines are stacked and separated from each other by interlayer insulating layers that are interposed between the word lines; and a plurality of phase change (PC) structures disposed on the cell region, each PC structure extending substantially in parallel to each other PC structure and extending along a second direction substantially orthogonal with respect to the first direction, each PC structure also substantially extending in parallel to the planar semiconductor substrate, and that the PC structures are also stacked and separated from each other by the interlayer insulating layers that are also interposed between the PC structures, wherein each PC structure comprises a switching device contacting one sidewall of the word line, a heating electrode contacting one sidewall of the switching device and a phase change pattern contacting one sidewall of the heating electrode, and the second direction is substantially parallel to the planar semiconductor substrate.

13. The phase change memory device of claim 12, wherein the word line is a metallic word line.

14. The phase change memory device of claim 12, wherein the switching device of each PC structure comprises a conductive polysilicon Schottky diode between the word line and the heating electrode.

15. The phase change memory device of claim 12, wherein each PC structure further comprises an ohmic contact layer between the switching device and the heating electrode.

16. The phase change memory device of claim 15, wherein the heating electrode is formed to surround a surface of the phase change pattern except the one side wall of the phase change pattern which is contacted to an upper electrode.

17. The phase change memory device of claim 12, further comprising upper electrodes contacting the PC structure such that the upper electrodes are aligned to be substantially perpendicular with respect to the planar semiconductor substrate and substantially parallel to the stacked word lines.

18. The phase change memory device of claim 17, wherein each upper electrode contacts phase change patterns of PC structures that are stacked directly on top of each other.

19. The phase change memory device of claim 17, further comprising a device isolation layer includes a first device isolation layer and a second device isolation layer, wherein the first device isolation layer is disposed at one sidewall of the upper electrodes, and the second device isolation layer is disposed at the other sidewall of the word lines.

20. The phase change memory device of claim 17, further comprising bit lines formed over the PC structures such that the bit lines contact with the upper electrodes.

21. The phase change memory device of claim 20, wherein one of the interlayer insulating layers is disposed on top of all of the PC structures.

22. The phase change memory device of claim 20, further comprising a plurality of word line wirings formed over the bit lines and electrically insulated from each bit line and electrically connected to word lines.

23. The phase change memory device of claim 22, wherein the word line wirings are mutually insulated from one another and are arranged substantially in parallel to each other.

24. The phase change memory device of claim 22, wherein the stacked word lines have different lengths such that word lines that are closer to the semiconductor substrate are longer than word lines that are farther away from the semiconductor substrate.

25. The phase change memory device of claim 24, further comprising an inter-metal insulating layer disposed between the bit lines and the plurality of word line wirings.

26. The phase change memory device of claim 25, wherein the word line wirings and the word lines are respectively connected together through a plurality of contact plugs that penetrate through the inter-metal layer insulating layer.

* * * * *